US010468515B2

(12) United States Patent
Ina et al.

(10) Patent No.: US 10,468,515 B2
(45) Date of Patent: Nov. 5, 2019

(54) SEMICONDUCTOR DEVICE AND POWER CONVERTER

(71) Applicant: TOYODA GOSEI CO., LTD., Kiyosu-shi (JP)

(72) Inventors: Tsutomu Ina, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/164,677

(22) Filed: May 25, 2016

(65) Prior Publication Data
US 2017/0092754 A1 Mar. 30, 2017

(30) Foreign Application Priority Data

Sep. 24, 2015 (JP) .................................. 2015-186506
Feb. 25, 2016 (JP) .................................. 2016-033752

(51) Int. Cl.
*H01L 29/78* (2006.01)
*H01L 29/778* (2006.01)
(Continued)

(52) U.S. Cl.
CPC ...... *H01L 29/7787* (2013.01); *H01L 29/0878* (2013.01); *H01L 29/1045* (2013.01);
(Continued)

(58) Field of Classification Search
CPC ... H01L 27/1222; H01L 29/06; H01L 29/732; H01L 29/739; H01L 29/7395;
(Continued)

(56) References Cited

U.S. PATENT DOCUMENTS

2009/0200559 A1   8/2009 Suzuki et al.
2012/0025874 A1*  2/2012 Saikaku .............. H01L 29/1095
                                                 327/109
(Continued)

FOREIGN PATENT DOCUMENTS

CN       102347356 A    2/2012
JP       2009-194065 A  8/2009
(Continued)

OTHER PUBLICATIONS

Japanese Office Action, dated Feb. 5, 2019, in Japanese Application No. 2016-033752 and English Translation thereof.
(Continued)

*Primary Examiner* — Jae Lee
(74) *Attorney, Agent, or Firm* — McGinn I. P. Law Group, PLLC.

(57) ABSTRACT

There is provided a semiconductor device comprising a substrate, a first semiconductor layer, a second semiconductor layer, a third semiconductor layer, a trench and an insulating film arranged to cover a surface of the trench. The first semiconductor layer has a carrier concentration that provides a peak in a thickness direction perpendicular to a plane direction. A high carrier concentration area having a peak of the carrier concentration in the first semiconductor layer is extended in the plane direction at a location away from the trench to be located on the substrate side of the trench. This configuration reduces the on resistance while suppressing reduction of the breakdown voltage in the semiconductor device.

21 Claims, 6 Drawing Sheets

(51) Int. Cl.
| | |
|---|---|
| *H01L 29/10* | (2006.01) |
| *H01L 29/20* | (2006.01) |
| *H01L 29/205* | (2006.01) |
| *H01L 29/423* | (2006.01) |
| *H01L 29/66* | (2006.01) |
| *H02M 1/08* | (2006.01) |
| *H02M 1/42* | (2007.01) |
| *H02M 7/06* | (2006.01) |
| *H01L 29/08* | (2006.01) |
| *H02M 7/00* | (2006.01) |

(52) U.S. Cl.
CPC ........ *H01L 29/2003* (2013.01); *H01L 29/205* (2013.01); *H01L 29/4236* (2013.01); *H01L 29/66462* (2013.01); *H01L 29/7813* (2013.01); *H02M 1/08* (2013.01); *H02M 1/42* (2013.01); *H02M 7/06* (2013.01); *H01L 29/1095* (2013.01); *H02M 1/4225* (2013.01); *H02M 7/003* (2013.01); *Y02B 70/126* (2013.01)

(58) Field of Classification Search
CPC ..... H01L 29/7397; H01L 29/76; H01L 29/78; H01L 29/7813; H01L 29/783
See application file for complete search history.

(56) References Cited

U.S. PATENT DOCUMENTS

| | | | |
|---|---|---|---|
| 2012/0074459 A1* | 3/2012 | Ogura | H01L 29/0696 257/139 |
| 2012/0267681 A1* | 10/2012 | Nemoto | H01L 21/263 257/139 |
| 2013/0214348 A1* | 8/2013 | Takeda | H01L 29/7827 257/330 |
| 2014/0264564 A1* | 9/2014 | Cheng | H01L 29/7827 257/330 |
| 2015/0200248 A1* | 7/2015 | Ono | H01L 29/407 257/330 |
| 2015/0349111 A1 | 12/2015 | Yoshikawa | |
| 2017/0110534 A1 | 4/2017 | Shiomi | |
| 2017/0133504 A1* | 5/2017 | Shiomi | H01L 29/739 |

FOREIGN PATENT DOCUMENTS

| | | |
|---|---|---|
| JP | 4793390 B2 | 10/2011 |
| JP | 2013-149789 A | 8/2013 |
| JP | 2013-171931 A | 9/2013 |
| JP | 2015/192027 A | 11/2015 |
| WO | WO 2015/008458 A1 | 1/2015 |

OTHER PUBLICATIONS

Chinese Office Action, dated Nov. 5, 2018, in Chinese Application No. 201610349780.X and English Translation thereof.

* cited by examiner

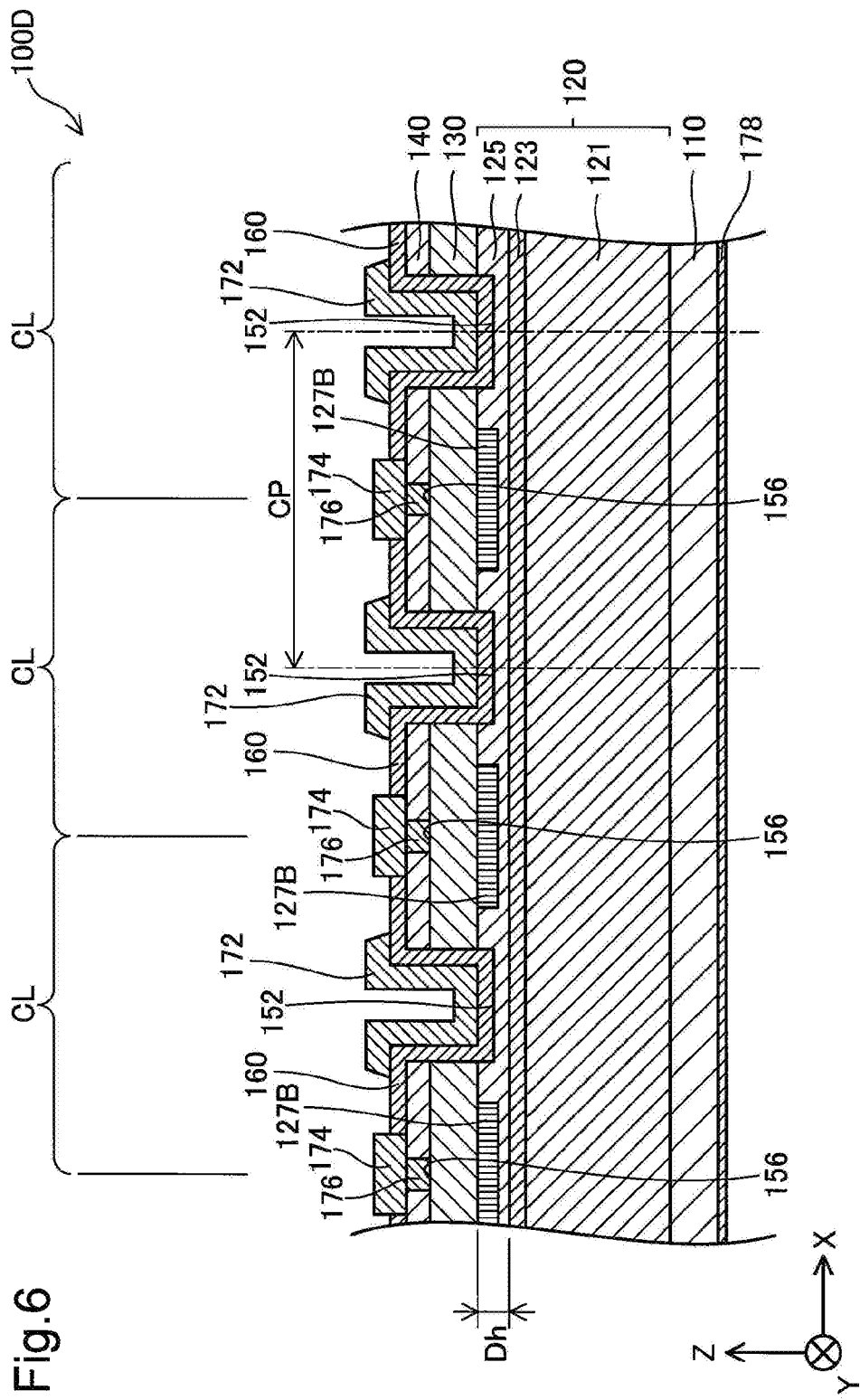

SEMICONDUCTOR DEVICE AND POWER CONVERTER

CROSS-REFERENCE TO RELATED APPLICATION

The present application claims priority from Japanese patent applications No. 2015-186506 filed on Sep. 24, 2015 and No. 2016-033752 filed on Feb. 25, 2016, the contents of which are hereby incorporated by reference into this application.

BACKGROUND

Technical Field

The invention relates to a semiconductor device and a power converter.

Description of the Related Art

A vertical transistor having a trench gate structure in which a gate electrode is formed in a trench (groove) has been known as a semiconductor device (semiconductor element). JP 2009-194065A discloses a configuration that a current dispersion layer is provided between a drift layer and a channel layer at a depth where a trench is formed in the vertical transistor, for the purpose of reducing the on resistance. This current dispersion layer has similar conductive properties to those of the drift layer but has a higher carrier concentration than the carrier concentration of the drift layer.

The inventors of the present application have, however, found that the technique of JP 2009-194065A fails to sufficiently reduce the on resistance since a depletion layer formed at a p-n junction interface between the drift layer (n type) and the channel layer (p type) is extended into the current dispersion layer and thereby interferes with dispersion of the current in the current dispersion layer. With regard to the technique of JP 2009-194065A, further increasing the carrier concentration in the current dispersion layer or increasing the thickness of the current dispersion layer for the purpose of suppressing the effects of the depletion layer is likely to cause the potential crowding at the corner of the trench and thereby reduces the breakdown voltage. There is accordingly a demand for a technique that reduces the on resistance while suppressing reduction of the breakdown voltage in the vertical transistor having the trench gate structure.

SUMMARY

In order to solve at least part of the problems described above, the invention may be implemented by aspects described below.

(1) According to one aspect of the invention, there is provided a semiconductor device. The semiconductor device comprises: a substrate that is extended in a plane direction; a first semiconductor layer that is located above the substrate and has one characteristic out of an n-type characteristic and a p-type characteristic; a second semiconductor layer that is located above the first semiconductor layer and has the other characteristic out of the n-type characteristic and the p-type characteristic which is different from the one characteristic; a third semiconductor layer that is located above the second semiconductor layer and has the one characteristic; a trench that is formed from the third semiconductor layer to penetrate through the second semiconductor layer and to be recessed into the first semiconductor layer; and an insulating film that is arranged to cover a surface of the trench, wherein the first semiconductor layer has a carrier concentration that provides a peak in a thickness direction perpendicular to the plane direction, and a high carrier concentration area having a peak of the carrier concentration in the first semiconductor layer is extended in the plane direction at a location away from the trench to be located on the substrate side of the trench. In the semiconductor device of this aspect, the high carrier concentration area is provided at a location away from the trench to be located on the substrate side of the trench in the first semiconductor layer. This reduces the effects of a depletion layer formed at a p-n junction interface between the first semiconductor layer and the second semiconductor layer on the high carrier concentration area. This configuration enables the electric current flowing into the first semiconductor layer through a channel formed in the second semiconductor layer to be sufficiently dispersed in the plane direction in the high carrier concentration area that is provided away from the trench to be located on the substrate side of the trench in the first semiconductor layer. As a result, this reduces the on resistance, while suppressing reduction of the breakdown voltage.

(2) According to one embodiment of the semiconductor device of the above aspect, the carrier concentration in the high carrier concentration area may be not lower than $1.0 \times 10^{16}$ cm$^{-3}$ and not higher than $1.0 \times 10^{18}$ cm$^{-3}$. The semiconductor device of this aspect provides the sufficient breakdown voltage, while sufficiently dispersing the current in the plane direction.

(3) According to one embodiment of the semiconductor device of the above aspect, the high carrier concentration area may be provided at a location closer to the second semiconductor layer than the substrate. The semiconductor device of this aspect enables the electric current flowing into the first semiconductor layer through the channel to be effectively dispersed.

(4) According to one embodiment of the semiconductor device of the above aspect, the high carrier concentration area may have a thickness of not less than 10 nm and not greater than 10 μm. The semiconductor device of this aspect provides the sufficient breakdown voltage, while sufficiently dispersing the current in the plane direction.

(5) According to one embodiment of the semiconductor device of the above aspect, the first semiconductor layer may comprise: a first area that is located on the substrate side of the high carrier concentration area; and a second area that is located on the second semiconductor layer side of the high carrier concentration area, wherein the carrier concentration in the first area is equal to the carrier concentration in the second area. The semiconductor device of this aspect provides the sufficient breakdown voltage.

(6) According to one embodiment, the semiconductor device of any of the above aspect may have a configuration such that a plurality of cells in an identical shape are regularly arrayed in the plane direction, wherein a distance from the second semiconductor layer to the high carrier concentration area is not greater than half a cell pitch of the cells. The semiconductor device of this aspect sufficiently disperses the current in the plane direction.

(7) According to one embodiment of the semiconductor device of the above aspect, the first semiconductor layer may be mainly made of a compound semiconductor. This aspect reduces the on resistance while suppressing reduction of the breakdown voltage in the semiconductor device using the compound semiconductor.

(8) According to one embodiment of the semiconductor device of the above aspect, the first semiconductor layer may be mainly made of gallium nitride (GaN). This aspect reduces the on resistance while suppressing reduction of the breakdown voltage in the semiconductor device using gallium nitride (GaN).

(9) According to one embodiment, the semiconductor device of any of the above aspect may further comprise a third area that is located between the second semiconductor layer and the high carrier concentration area and has the other characteristic, wherein the third area is located away from the trench in the plane direction. The semiconductor device of this aspect reduces the potential crowding in the vicinity of the outer circumference of the bottom face of the trench and thus more effectively suppresses reduction of the breakdown voltage.

(10) According to one embodiment of the semiconductor device of the above aspect, the third area may be located away from the high carrier concentration area in the thickness direction. The semiconductor device of this aspect more effectively reduces the on resistance.

The invention may be implemented by any of various aspects other than the semiconductor device, for example, a power converter including the semiconductor device of any of the above aspects, a manufacturing method of manufacturing the semiconductor device of any of the above aspects, and a manufacturing apparatus that implements the manufacturing method.

According to the above aspects of the invention, the high carrier concentration area is provided at a location away from the trench to be located on the substrate side of the trench in the first semiconductor layer. This reduces the effects of a depletion layer formed at a p-n junction interface between the first semiconductor layer and the second semiconductor layer on the high carrier concentration area. This configuration enables the electric current flowing into the first semiconductor layer through a channel formed in the second semiconductor layer to be sufficiently dispersed in the plane direction in the high carrier concentration area that is provided away from the trench to be located on the substrate side of the trench in the first semiconductor layer. As a result, this reduces the on resistance, while suppressing reduction of the breakdown voltage.

BRIEF DESCRIPTION OF THE DRAWINGS

FIG. 6 is an enlarged sectional view illustrating a semiconductor device according to a sixth embodiment.

DESCRIPTION OF THE EMBODIMENTS

A. First Embodiment

Figure 1:
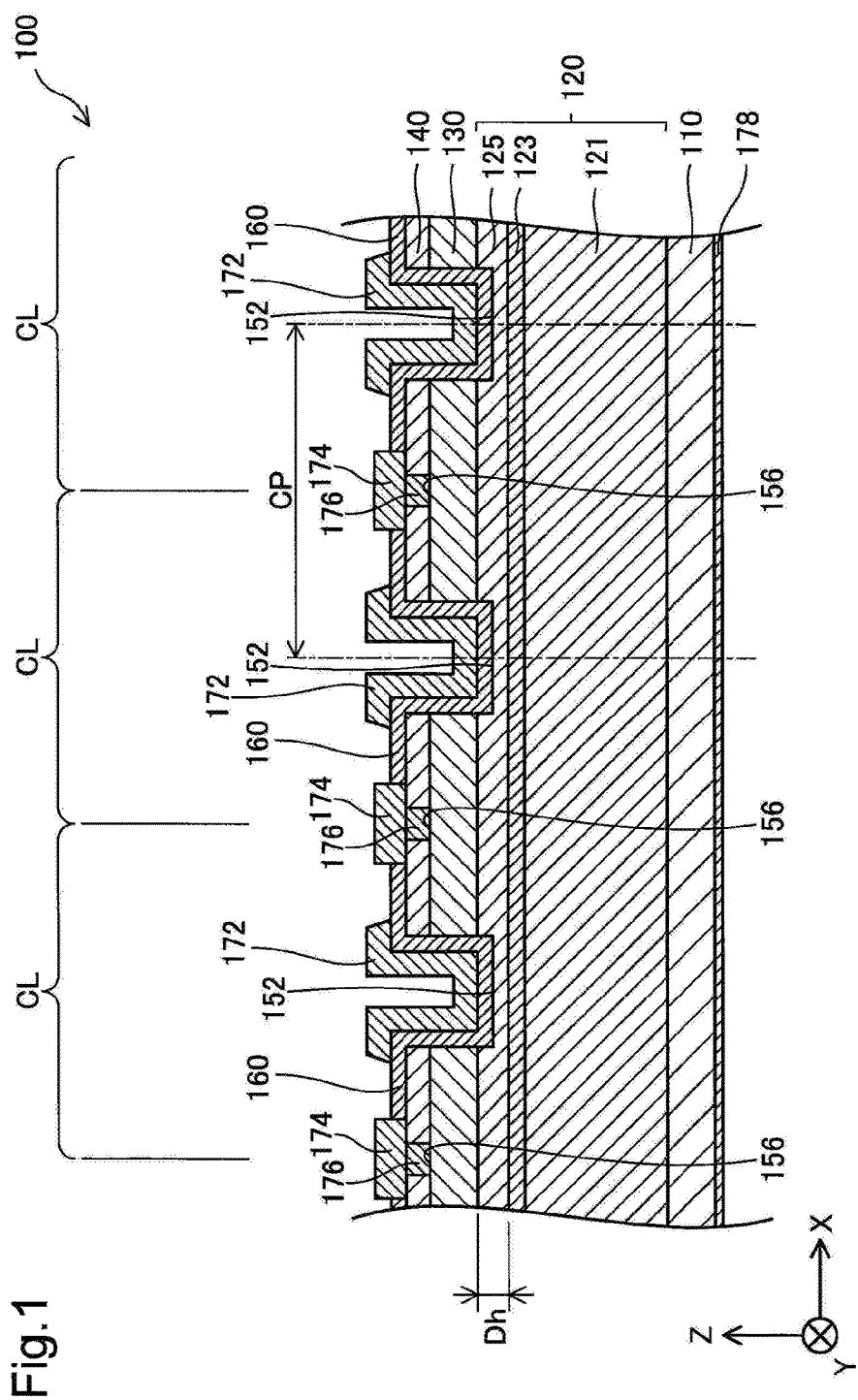
FIG. 1 is a sectional view schematically illustrating the configuration of a semiconductor device.
Figure 2:
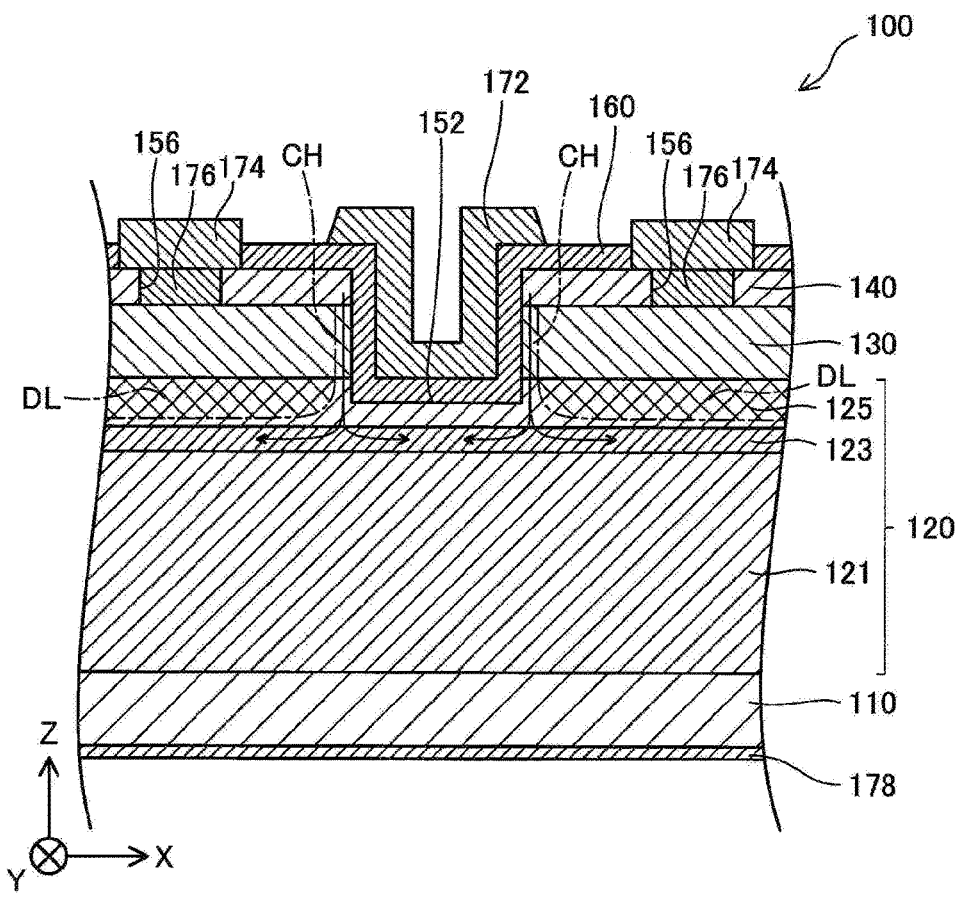
FIG. 2 is an enlarged sectional view illustrating the semiconductor device.

FIG. 1 is a sectional view schematically illustrating the configuration of a semiconductor device 100. FIG. 2 is an enlarged sectional view illustrating the semiconductor device 100.

XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface. The XYZ axes illustrated in other drawings correspond to the XYZ axes of FIG. 1.

The semiconductor device 100 is a vertical transistor having a trench gate structure. According to this embodiment, the semiconductor device 100 is a vertical trench MOSFET (metal-oxide-semiconductor field-effect transistor). According to this embodiment, the semiconductor device 100 is used for power control and is also called power device. According to this embodiment, the semiconductor device 100 is a GaN-based semiconductor device formed from gallium nitride (GaN) as one of compound semiconductors.

The semiconductor device 100 has a configuration such that a plurality of cells CL in an identical shape are regularly arrayed in the plane direction (in at least one of the X-axis direction and the Y-axis direction). According to this embodiment, the semiconductor device 100 has a configuration such that a plurality of cells CL in a regular hexagonal shape viewed from the +Z-axis direction are regularly arrayed in the X-axis direction and the Y-axis direction. According to another embodiment, the semiconductor device 100 may have a configuration such that a plurality of cells CL in a rectangular shape linearly extended in the Y-axis direction are regularly arrayed in the X-axis direction or that a plurality of cells CL in another polygonal shape (for example, square shape) different from the regular hexagonal shape are regularly arrayed in the X-axis direction and the Y-axis direction.

The semiconductor device 100 includes a substrate 110, an n-type semiconductor layer 120, a p-type semiconductor layer 130 and an n-type semiconductor layer 140. The semiconductor device 100 has trenches 152 and recesses 156 as structures formed in the respective semiconductor layers. The semiconductor device 100 also includes an insulating film 160, a gate electrode 172 as a control electrode, a source electrode 174 as a first electrode, a p-body electrode 176 as a second electrode and a drain electrode 178 as a third electrode. The n-type semiconductor layer 120 is also called first semiconductor layer, the p-type semiconductor layer 130 is also called second semiconductor layer, and the n-type semiconductor layer 140 is also called third semiconductor layer.

The substrate 110 of the semiconductor device 100 is a plate-like semiconductor extended in the plane direction (X-axis direction and Y-axis direction). According to this embodiment, the substrate 110 is mainly made of gallium nitride (GaN). In the description hereof, the expression of "mainly made of gallium nitride (GaN)" means "containing gallium nitride (GaN) at 90% or a higher molar fraction. According to this embodiment, the substrate 110 is an n-type semiconductor having n-type characteristics. According to this embodiment, the substrate 110 contains silicon (Si) as the donor element. According to this embodiment, the average concentration of silicon (Si) contained in the substrate 110 is about $1.0 \times 10^{18}$ cm$^{-3}$. The thickness (length in the Z-axis direction) of the substrate 110 is preferably not less than 100 μm and not greater than 500 μm and is about 300 μm according to this embodiment.

The n-type semiconductor layer 120 of the semiconductor device 100 is a semiconductor having n-type characteristics. The n-type semiconductor layer 120 is located above the substrate 110. According to this embodiment, the n-type semiconductor layer 120 is located on the +Z-axis direction side of the substrate 110. According to this embodiment, the n-type semiconductor layer 120 is extended in the plane direction (X-axis direction and Y-axis direction). According to this embodiment, the n-type semiconductor layer 120 is mainly made of gallium nitride (GaN). According to this embodiment, the n-type semiconductor layer 120 contains silicon (Si) as the donor element. The carrier concentration of the n-type semiconductor layer 120 has a peak in the thickness direction (Z-axis direction). The n-type semiconductor layer 120 includes a low carrier concentration area 121, a high carrier concentration area 123 and a low carrier concentration area 125. The low carrier concentration area 121 is also called first area, and the low carrier concentration area 125 is also called second area.

The low carrier concentration area 121 of the n-type semiconductor layer 120 is the first area located on the substrate 110-side of the high carrier concentration area 123 among the areas constituting the n-type semiconductor layer 120. The carrier concentration of the low carrier concentration area 121 is lower than the carrier concentration of the high carrier concentration area 123. According to this embodiment, the carrier concentration of the low carrier concentration area 121 is substantially constant in the Z-axis direction, except the vicinity of the boundary with the high carrier concentration area 123. According to another embodiment, the carrier concentration of the low carrier concentration area 121 may be varied by smaller amounts than the difference in carrier concentration between the low carrier concentration area 121 and the high carrier concentration area 123. According to this embodiment, the average concentration of silicon (Si) contained in the low carrier concentration area 121 is about $1.0 \times 10^{16}$ cm$^{-3}$. According to this embodiment, the thickness (length in the Z-axis direction) of the low carrier concentration area 121 is about 10 μm.

The high carrier concentration area 123 of the n-type semiconductor layer 120 is an area having a peak carrier concentration of the n-type semiconductor layer 120 among the areas constituting the n-type semiconductor layer 120. In other words, the carrier concentration of the high carrier concentration area 123 is higher than the carrier concentrations of the low carrier concentration areas 121 and 125. According to this embodiment, the carrier concentration of the high carrier concentration area 123 is substantially constant in the Z-axis direction, except the vicinities of the boundaries with the low carrier concentration areas 121 and 125. According to another embodiment, the carrier concentration of the high carrier concentration area 123 may be varied by smaller amounts than the differences in carrier concentration between the high carrier concentration area 123 and the low carrier concentration areas 121 and 125. The average concentration of silicon (Si) contained in the high carrier concentration area 123 is preferably not lower than $1.0 \times 10^{16}$ cm$^{-3}$ and not higher than $1.0 \times 10^{18}$ cm$^{-3}$ and is $1.2 \times 10^{16}$ cm$^{-3}$ according to this embodiment. The carrier concentration of lower than $1.0 \times 10^{16}$ cm$^{-3}$ in the high carrier concentration area 123 causes a failure to sufficiently disperse the current in the high carrier concentration area 123.

The carrier concentration of higher than $1.0 \times 10^{18}$ cm$^{-3}$ in the high carrier concentration area 123, on the other hand, causes a failure to provide the sufficient breakdown voltage.

The high carrier concentration area 123 is extended in the plane direction (X-axis direction and Y-axis direction) at a location away from the trench 152 to be located on the substrate 110-side of the trench 152. According to this embodiment, the low carrier concentration area 121 is provided at a location closer to the p-type semiconductor layer 130 than the substrate 110. According to this embodiment, a distance Dh from the p-type semiconductor layer 130 to the high carrier concentration area 123 is not greater than half a cell pitch CP that is an interval between reference points of adjacent cells CL.

The thickness (length in the Z-axis direction) of the high carrier concentration area 123 is preferably not less than 10 nm in terms of stably forming the high carrier concentration area 123 in the plane direction. In terms of providing the sufficient breakdown voltage, on the other hand, the thickness of the high carrier concentration area 123 is preferably less than the thickness of the low carrier concentration area 121 and is thus preferably not greater than 10 μm. According to this embodiment, the thickness of the high carrier concentration area 123 is about 2.0 μm.

The low carrier concentration area 125 of the n-type semiconductor layer 120 is the second area located on the p-type semiconductor layer 130-side of the high carrier concentration area 123 among the areas constituting the n-type semiconductor layer 120. The carrier concentration of the low carrier concentration area 125 is lower than the carrier concentration of the high carrier concentration area 123. According to this embodiment, the carrier concentration of the low carrier concentration area 125 is substantially constant in the Z-axis direction, except the vicinity of the boundary with the high carrier concentration area 123. According to another embodiment, the carrier concentration of the low carrier concentration area 125 may be varied by smaller amounts than the difference in carrier concentration between the low carrier concentration area 125 and the high carrier concentration area 123. According to this embodiment, the carrier concentration of the low carrier concentration area 125 is approximately equal to the carrier concentration of the low carrier concentration area 121. According to this embodiment, the average concentration of silicon (Si) contained in the low carrier concentration area 125 is about $1.0 \times 10^{16}$ cm$^{-3}$. According to this embodiment, the thickness (length in the Z-axis direction) of the low carrier concentration area 125 is about 0.5 μm.

According to this embodiment, the n-type semiconductor layer 120 is formed on the substrate 110 by epitaxial growth of metal organic chemical vapor deposition (MOCVD). According to this embodiment, the low carrier concentration area 121, the high carrier concentration area 123 and the low carrier concentration area 125 are formed by changing the supply amount of a dopant that is to be supplied in the middle of growth of the n-type semiconductor layer 120. According to another embodiment, the high carrier concentration area 123 may be formed by ion implantation of the dopant after epitaxial growth of the n-type semiconductor layer 120 to the thickness corresponding to the high carrier concentration area 123. In this latter case, the low carrier concentration area 125 is formed on the high carrier concentration area 123 by regrowth after the ion implantation.

The p-type semiconductor layer 130 of the semiconductor device 100 is a semiconductor having p-type characteristics. The p-type semiconductor layer 130 is located above the n-type semiconductor layer 120. According to this embodiment, the p-type semiconductor layer 130 is located on the +Z-axis direction side of the n-type semiconductor layer 120. According to this embodiment, the p-type semiconductor layer 130 is extended in the plane direction (X-axis direction and Y-axis direction). According to this embodiment, the p-type semiconductor layer 130 is mainly made of gallium nitride (GaN). According to this embodiment, the p-type semiconductor layer 130 contains magnesium (Mg) as the acceptor element. According to this embodiment, the average concentration of magnesium (Mg) contained in the p-type semiconductor layer 130 is about $1.0 \times 10^{18}$ cm$^{-3}$. According to this embodiment, the thickness (length in the Z-axis direction) of the p-type semiconductor layer 130 is about 1.0 μm.

The n-type semiconductor layer 140 of the semiconductor device 100 is a semiconductor having n-type characteristics. The n-type semiconductor layer 140 is located above the p-type semiconductor layer 130. According to this embodiment, the n-type semiconductor layer 140 is located on the +Z-axis direction side of the p-type semiconductor layer 130. According to this embodiment, the n-type semiconductor layer 140 is extended in the plane direction (X-axis direction and Y-axis direction). According to this embodiment, the n-type semiconductor layer 140 is mainly made of gallium nitride (GaN). According to this embodiment, the n-type semiconductor layer 140 contains silicon (Si) as the donor element. According to this embodiment, the average concentration of silicon (Si) contained in the n-type semiconductor layer 140 is about $3.0 \times 10^{18}$ cm$^{-3}$. According to this embodiment, the thickness (length in the Z-axis direction) of the n-type semiconductor layer 140 is about 0.3 μm.

The trench 152 of the semiconductor drive 100 is a groove that is formed from the n-type semiconductor layer 140 to penetrate through the p-type semiconductor layer 130 and to be recessed into the n-type semiconductor layer 120. According to this embodiment, the trench 152 is recessed into the low carrier concentration area 125 of the n-type semiconductor layer 120. The trench 152 is away from the high carrier concentration area 123 of the n-type semiconductor layer 120. According to this embodiment, the depth (length in the Z-axis direction) of the trench 152 is 1.5 μm. According to this embodiment, the trench 152 is a structure formed by dry etching of the respective semiconductor layers.

The recess 156 of the semiconductor device 100 is a concave that is recessed to penetrate through the n-type semiconductor layer 140 and reach the p-type semiconductor layer 130. According to this embodiment, the recess 156 is a structure formed by dry etching of the respective semiconductor layers.

The insulating film 160 of the semiconductor device 100 is a film having electrical insulating properties. The insulating film 160 is arranged to cover the surface of the trench 152. According to this embodiment, the insulating film 160 is formed from inside to outside of the trench 152. According to this embodiment, the insulating film 160 is mainly made of silicon dioxide ($SiO_2$).

The gate electrode 172 of the semiconductor device 100 is an electrode that is formed inside of the trench 152 across the insulating film 160. According to this embodiment, the gate electrode 172 is formed from inside to outside of the trench 152. According to this embodiment, the gate electrode 172 is mainly made of aluminum (Al). When a voltage is applied to the gate electrode 172, an inversion layer is formed in the p-type semiconductor layer 130 to serve as a channel CH, so that a conductive path is formed between the source electrode 174 and the drain electrode 178.

The source electrode 174 of the semiconductor device 100 is a first electrode that is in ohmic contact with the n-type semiconductor layer 140. According to this embodiment, the source electrode 174 is formed from on the p-body electrode 176 toward on the n-type semiconductor layer 140. According to this embodiment, the source electrode 174 is a multilayer electrode by stacking a layer mainly made of titanium (Ti), a layer mainly made of aluminum (Al) and a layer mainly made of palladium (Pd) sequentially from the n-type semiconductor layer 140-side.

The p-body electrode 176 of the semiconductor device 100 is a second electrode that is in ohmic contact with the p-type semiconductor layer 130. According to this embodiment, the p-body electrode 176 is formed inside of the recess 156. According to this embodiment, the p-body electrode 176 is mainly made of palladium (Pd).

The drain electrode 178 of the semiconductor device 100 is a third electrode that is in ohmic contact with the −Z-axis direction side surface of the substrate 110. According to this embodiment, the drain electrode 178 is a multilayer electrode by stacking a layer mainly made of titanium (Ti) and a layer mainly made of aluminum (Al) sequentially from the substrate 110-side.

According to the first embodiment described above, the high carrier concentration area 123 is provided at the location away from the trench 152 to be located on the substrate 110-side of the trench 152 in the n-type semiconductor layer 120. This configuration reduces the effects of a depletion layer DL formed at a p-n junction interface between the n-type semiconductor layer 120 and the p-type semiconductor layer 130 on the high carrier concentration area 123. This accordingly enables the electric current flowing into the n-type semiconductor layer 120 through the channel CH formed in the p-type semiconductor layer 130 to be sufficiently dispersed in the plane direction (X-axis direction and Y-axis direction) in the high carrier concentration area 123 that is provided away from the trench 152 to be located on the substrate 110-side of the trench 152 in the n-type semiconductor layer 120. As a result, this reduces the on resistance, while suppressing reduction of the breakdown voltage. According to this embodiment, as shown in FIG. 2, the high carrier concentration area 123 is designed to be away from the depletion layer DL. According to another embodiment, part of the high carrier concentration area 123 may be overlapped with the depletion layer DL. In other words, the requirement is that the entire high carrier concentration area 123 should not be overlapped with the depletion layer DL. According to this embodiment, the depletion layer DL denotes a depletion layer at zero bias where no voltage is applied to the semiconductor device 100.

The carrier concentration in the high carrier concentration area 123 is not lower than $1.0 \times 10^{16}$ cm$^{-3}$ and not higher than $1.0 \times 10^{18}$ cm$^{-3}$. This provides the sufficient breakdown voltage, while sufficiently dispersing the current in the plane direction (X-axis direction and Y-axis direction).

The high carrier concentration area 123 may be provided at a location closer to the n-type semiconductor layer 140 than the substrate 110. This configuration enables the electric current flowing into the n-type semiconductor layer 120 through the channel CH to be effectively dispersed.

The thickness of the high carrier concentration area 123 is not less than 10 nm and not greater than 10 μm. This also provides the sufficient breakdown voltage, while sufficiently dispersing the current in the plane direction (X-axis direction and Y-axis direction).

The carrier concentration in the low carrier concentration area 121 is equal to the carrier concentration in the low carrier concentration area 125. This also provides the sufficient breakdown voltage.

The distance Dh from the p-type semiconductor layer 130 to the high carrier concentration area 123 is not greater than half the cell pitch CP. This sufficiently disperses the current in the plane direction (X-axis direction and Y-axis direction). In the semiconductor device 100 of the embodiment, the high carrier concentration area 123 is away from the bottom face of the trench 152 by 0.3 μm. The distance between the high carrier concentration area 123 and the trench 152 is, however, not limited to this value. In terms of sufficiently dispersing the current in the plane direction (X-axis direction and Y-axis direction), the distance between the high carrier concentration area 123 and the bottom face of the trench 152 is preferably not less than 10 nm. In other words, it is preferable that the distance from the interface between the n-type semiconductor layer 120 and the p-type semiconductor layer 130 to the high carrier concentration area 123 is greater than the distance from the interface between the n-type semiconductor layer 120 and the p-type semiconductor layer 130 to the bottom face of the trench 152 by 10 nm or more.

B. Second Embodiment

Figure 3:
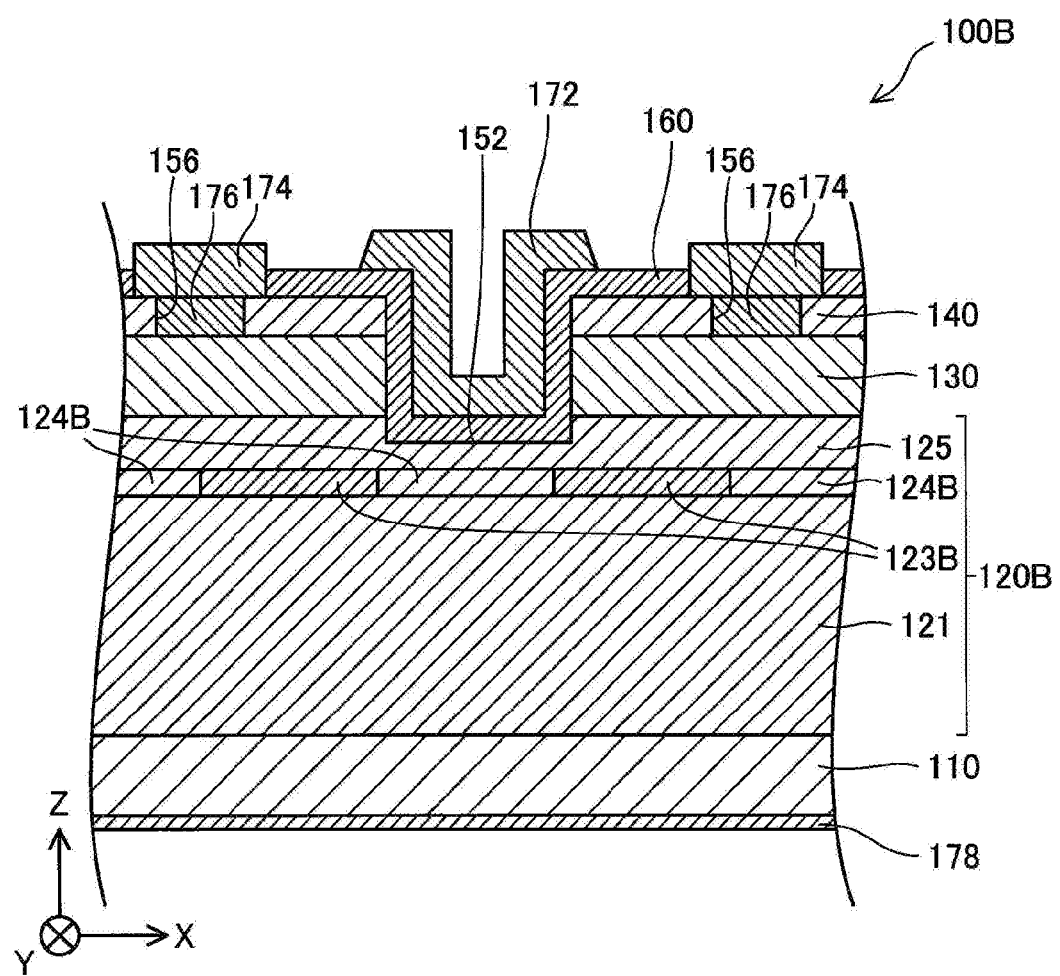
FIG. 3 is an enlarged sectional view illustrating a semiconductor device according to a second embodiment.

FIG. 3 is an enlarged sectional view illustrating a semiconductor device 100B according to a second embodiment. The XYZ axes are shown in FIG. 3, similarly to FIG. 1.

The semiconductor device 100B of the second embodiment has a configuration similar to that of the semiconductor device 100 of the first embodiment, except that an n-type semiconductor layer 120B is provided in place of the n-type semiconductor layer 120. The n-type semiconductor layer 120B of the semiconductor device 100B has a configuration similar to that of the n-type semiconductor layer 120 of the first embodiment, except that high carrier concentration areas 123B and low carrier concentration areas 124B are provided in place of the high carrier concentration area 123. The high carrier concentration areas 123B of the n-type semiconductor layer 120B are similar to the high carrier concentration area 123 of the first embodiment, except that the high carrier concentration areas 123B are formed partly in the plane direction (X-axis direction and Y-axis direction).

The low carrier concentration areas 124B of the n-type semiconductor layer 120B are areas located between the adjacent high carrier concentration areas 123B in the plane direction (X-axis direction and Y-axis direction). The low carrier concentration areas 124B are located between the low carrier concentration area 121 and the low carrier concentration area 125 in the Z-axis direction. The carrier concentration in the low carrier concentration areas 124B is lower than the carrier concentration in the high carrier concentration areas 123B. According to this embodiment, the carrier concentration in the low carrier concentration areas 124B is equal to the carrier concentration in the low carrier concentration area 121. According to this embodiment, the average concentration of silicon (Si) contained in the low carrier concentration areas 124B is about $1.0 \times 10^{16}$ cm$^{-3}$.

The configuration of the second embodiment described above reduces the on resistance while suppressing reduction of the breakdown voltage, like the first embodiment.

C. Third Embodiment

A semiconductor device of a third embodiment has a configuration similar to that of the semiconductor device 100 of the first embodiment, except different specification of a high carrier concentration area 123. The high carrier concentration area 123 of the third embodiment has the carrier concentration of $5.0 \times 10^{17}$ cm$^{-3}$ and the thickness of 0.05 μm but otherwise has a similar configuration to that of the high carrier concentration area 123 of the first embodiment. The configuration of the third embodiment reduces the on resistance while suppressing reduction of the breakdown voltage, like the first embodiment. According to a modification, the high carrier concentration area employed may be, for example, (i) a high carrier concentration area having the carrier concentration of $7.0 \times 10^{16}$ cm$^{-3}$ and the thickness of 0.5 μm or (ii) a high carrier concentration area having the carrier concentration of $1.1 \times 10^{17}$ cm$^{-3}$ and the thickness of 0.5 μm. Employing such a high carrier concentration area also reduces the on resistance while suppressing reduction of the breakdown voltage, like the first embodiment.

D. Fourth Embodiment

Figure 4:
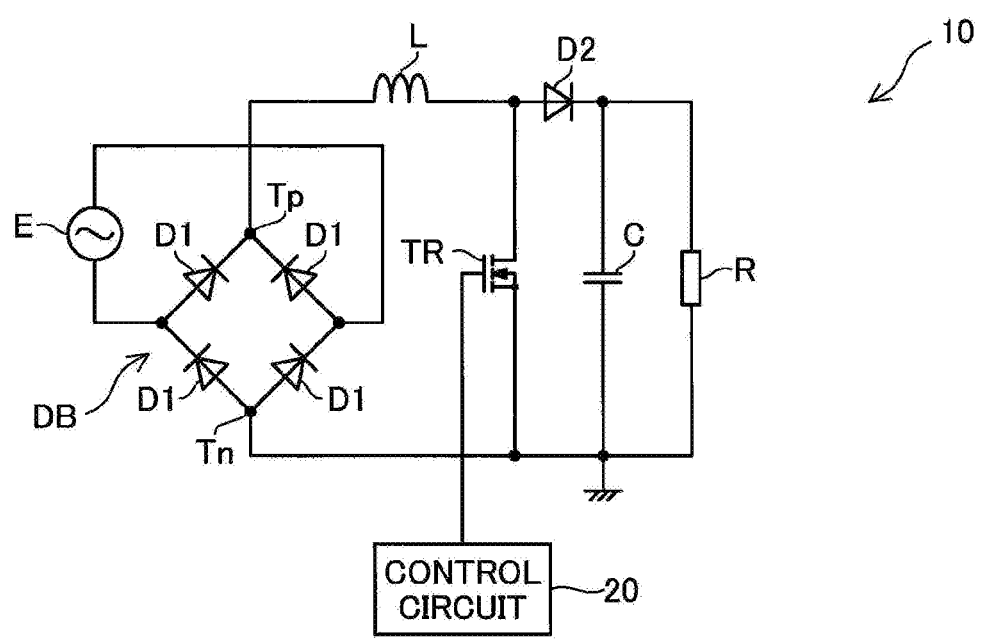
FIG. 4 is a diagram illustrating the configuration of a power converter.

FIG. 4 is a diagram illustrating the configuration of a power converter 10. The power converter 10 is an apparatus configured to convert electric power supplied from an AC power source E to a load R. The power converter 10 includes a control circuit 20, a transistor TR, four diodes D1, a coil L, a diode D2 and a capacitor C as components of a power factor correction circuit configured to improve the power factor of the AC power source E. According to this embodiment, the transistor TR is equivalent to the semiconductor device 100 of the first embodiment. According to another embodiment, the transistor TR may be equivalent to the semiconductor device 100B of the second embodiment or may be equivalent to the semiconductor device of the third embodiment.

The diodes D1 and D2 of the power converter 10 are Schottky barrier diodes. In the power converter 10, the four diodes D1 constitute a diode bride DB configured to rectify the AC voltage of the AC power source E. The diode bridge DB has a positive electrode output terminal Tp and a negative electrode output terminal Tn as DC-side terminals. The coil L is connected with the positive electrode output terminal Tp of the diode bridge DB. The anode side of the diode D2 is connected with the positive electrode output terminal Tp via the coil L. The cathode side of the diode D2 is connected with the negative electrode output terminal Tn via the capacitor C. The load R is connected in parallel with the capacitor C.

The transistor TR of the power converter 10 is an FET (field effect transistor). The source side of the transistor TR is connected with the negative electrode output terminal Tn. The drain side of the transistor TR is connected with the positive electrode output terminal Tp via the coil L. The gate side of the transistor TR is connected with the control circuit 20. The control circuit 20 of the power converter 10 controls the electric current between the source and the drain of the transistor TR, based on the voltage output to the load R and the electric current flowing in the diode bridge DB, in order to improve the power factor of the AC power source E.

The configuration of the fourth embodiment described above improves the device characteristics of the transistor TR. As a result, this enhances the power conversion efficiency of the power converter 10.

E. Fifth Embodiment

Figure 5:
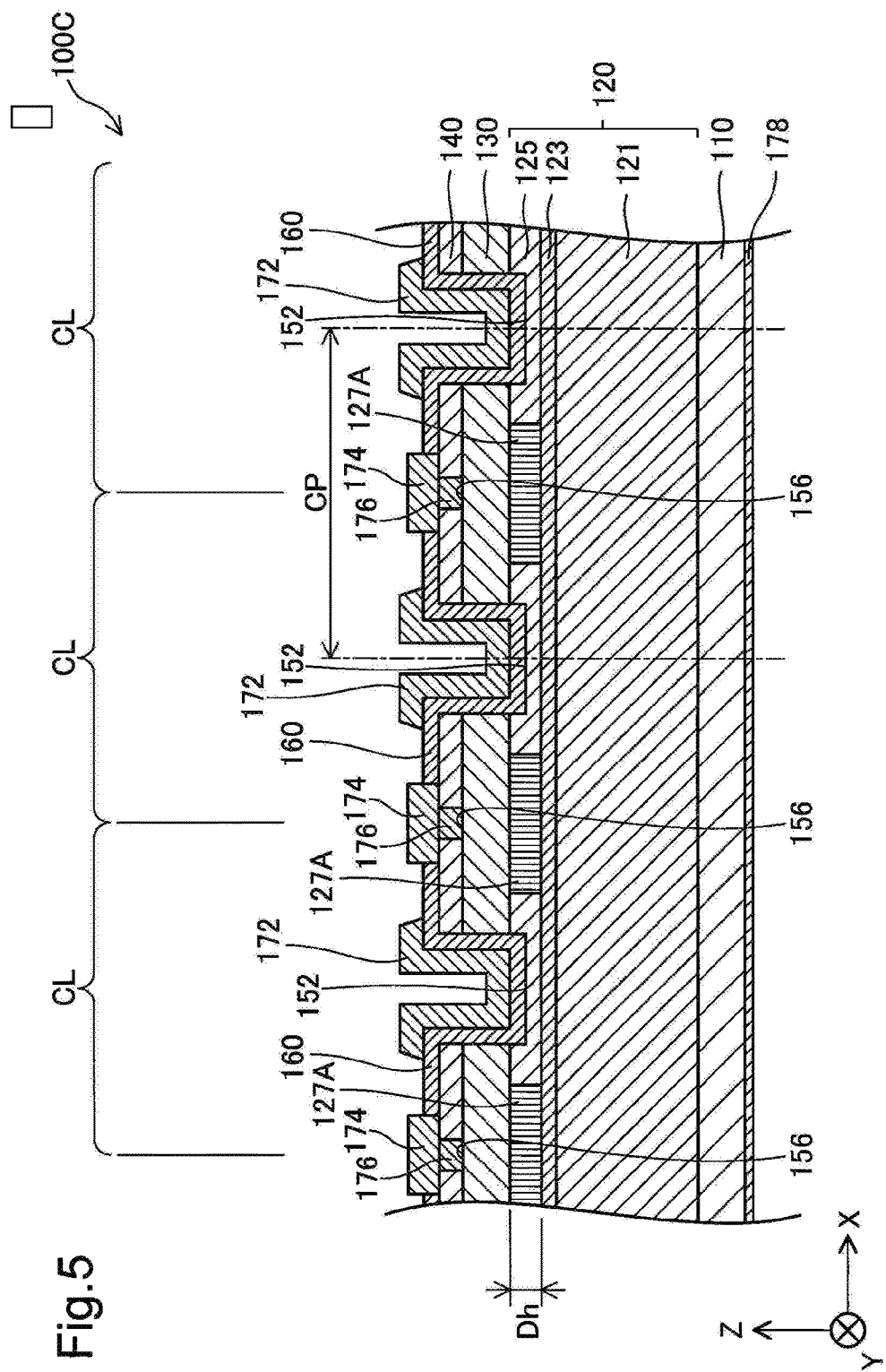
FIG. 5 is an enlarged sectional view illustrating a semiconductor device according to a fifth embodiment.

FIG. 5 is an enlarged sectional view illustrating a semiconductor device 100C according to a fifth embodiment. The XYZ axes are shown in FIG. 5, similarly to FIG. 1.

The semiconductor device 100C of the fifth embodiment has a configuration similar to that of the semiconductor device 100 of the first embodiment, except that p-type areas 127A are provided as potential crowding reduction areas in parts of the low carrier concentration area 125 between the p-type semiconductor layer 130 and the high carrier concentration area 123. The p-type areas 127A are located away from the trenches 152 in the plane direction (X-axis direction and Y-axis direction). The p-type area 127A is also called third area.

The p-type area 127A of this embodiment has the concentration of a dopant, which is added as the acceptor, of about $5.0 \times 10^{19}$ cm$^{-3}$ and the thickness of about 0.5 μm. According to this embodiment, the p-type areas 127A adjoin to and are in contact with the high carrier concentration area 123 in the thickness direction (Z-axis direction). A method employed to form the p-type areas 127A may be, for example, ion implantation of magnesium (Mg) as the dopant from above the low carrier concentration area 125.

The configuration of the fifth embodiment reduces the on resistance while suppressing reduction of the breakdown voltage, like the first embodiment. Additionally, the configuration of the fifth embodiment has the p-type areas 127A. This reduces the potential crowding in the vicinity of the outer circumference of the bottom face of the trench 152 and thus more effectively suppresses reduction of the breakdown voltage.

F. Sixth Embodiment

FIG. 6 is an enlarged sectional view illustrating a semiconductor device 100D according to a sixth embodiment. The XYZ axes are shown in FIG. 6, similarly to FIG. 1.

The semiconductor device 100D of the sixth embodiment has a configuration similar to that of the semiconductor device 100C of the fifth embodiment, except that p-type areas 127B are provided in place of the p-type areas 127A. The p-type area 127B of the semiconductor device 100D is located away from the high carrier concentration area 123 in the thickness direction (Z-axis direction) not to adjacent to or not to be in contact with the high carrier concentration area 123 but otherwise has a similar configuration to that of the p-type area 127A of the semiconductor device 100C. The bottom face of the p-type area 127B is preferably provided to be flush with the bottom face of the trench 152 or provided on the substrate 110-side, i.e., on the −Z-axis direction side of the bottom face of the trench 152. According to this embodiment, the thickness of the p-type area 127A is about 0.4 μm.

The configuration of the sixth embodiment reduces the on resistance while suppressing reduction of the breakdown voltage, like the first embodiment. Additionally, the configuration of the sixth embodiment has the p-type areas 127B. This reduces the potential crowding in the vicinity of the outer circumference of the bottom face of the trench 152 and thus more effectively suppresses reduction of the breakdown voltage.

Moreover, the p-type area 127B of the sixth embodiment is located away from the high carrier concentration area 123 in the thickness direction (Z-axis direction). This configuration reduces the effects of a depletion layer formed at an interface between the low carrier concentration area 125 and the p-type area 127B on the high carrier concentration area 123. As a result, this enables the electric current flowing into the n-type semiconductor layer 120 through the channel CH formed in the p-type semiconductor layer 130 to be sufficiently dispersed in the plane direction (X-axis direction and Y-axis direction) in the high carrier concentration area 123 that is provided away from the trench 152 to be located on the substrate 110-side of the trench 152 in the n-type semiconductor layer 120. Accordingly this more effectively reduces the on resistance.

G. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the present invention is applied to is not limited to the vertical trench MOSFET described above but may be any vertical transistor having the trench gate structure, for example, an insulated gate bipolar transistor (IGBT).

In the embodiments described above, the material of the substrate is not limited to gallium nitride (GaN) described above but may be any of silicon (Si), sapphire (Al$_2$O$_3$) and silicon carbide (SiC).

In the embodiments described above, the material of the respective semiconductor layers is not limited to gallium nitride (GaN) described above but may be any other compound semiconductor such as a group III nitride (for example, aluminum nitride (AlN) or indium nitride (InN)).

In the embodiments described above, the donor element contained in the n-type semiconductor layer is not limited to silicon (Si) but may be, for example, germanium (Ge) or oxygen (O).

In the embodiments described above, the acceptor element contained in the p-type semiconductor layer is not limited to magnesium (Mg) but may be, for example, zinc (Zn) or carbon (C).

In the embodiments described above, the relationship between the n type and the p type of the substrate and the respective semiconductor layers may be replaced.

In the embodiments described above, the n-type semiconductor layer 120 may have two or more high carrier concentration areas 123 at different locations in the Z-axis direction.

In the embodiments described above, the material of the insulating film is not limited to silicon dioxide (SiO$_2$) but may be any material having electrical insulating properties, for example, at least one of silicon nitride (SiNx), aluminum oxide (Al$_2$O$_3$), aluminum nitride (AlN), zirconium oxide (ZrO$_2$), hafnium oxide (HfO$_2$), silicon oxynitride (SiON), aluminum oxynitride (AlON), zirconium oxynitride (ZrON), and hafnium oxynitride (HfON). The insulating film may be a single layer or a two- or multi-layer.

In the embodiments described above, the materials of the respective electrodes are not limited to the materials of the above embodiments but may be any other suitable materials.

What is claimed is:
1. A field-effect transistor, comprising:
   a substrate of the field-effect transistor that is extended in a plane direction;

a first semiconductor layer that is located above the substrate and has one characteristic out of an n-type characteristic and a p-type characteristic;

a second semiconductor layer that is located above the first semiconductor layer and has an other characteristic out of the n-type characteristic and the p-type characteristic which is different from the one characteristic;

a third semiconductor layer that is located above the second semiconductor layer and has the one characteristic;

a trench that is formed from the third semiconductor layer to penetrate through the second semiconductor layer and to be recessed into the first semiconductor layer, and an insulating film that is arranged to cover a surface of the trench, wherein the first semiconductor layer has a carrier concentration that provides a peak in a thickness direction perpendicular to the plane direction, wherein the first semiconductor layer includes:
- a high carrier concentration layer having a peak of the carrier concentration and extending in the plane direction at a location away from the trench to be located on a substrate side of the trench, the high carrier concentration layer being separated from the trench and separated from a joint surface between the first semiconductor layer and the second semiconductor layer; and
- a low carrier concentration layer having a carrier concentration lower than the carrier concentration of the high carrier concentration layer, the low carrier concentration layer being disposed in the thickness direction on opposing sides of the high carrier concentration layer, wherein the carrier concentration represents a concentration of a donor or an acceptor, the donor or acceptor being a same impurity carrier as that of the first semiconductor layer, wherein the low carrier concentration layer is formed on the high carrier concentration layer by regrowth after ion implantation of the high carrier concentration layer, and wherein, in the thickness direction, a bottom surface of the trench is located above a top surface of the high carrier concentration layer.

2. The field-effect transistor according to claim 1, wherein the carrier concentration in the high carrier concentration layer is not lower than $1.0 \times 10^{16}$ cm$^{-3}$ and not higher than $1.0 \times 10^{18}$ cm$^3$.

3. The field-effect transistor according to claim 1, wherein the high carrier concentration layer is provided at a location closer to the second semiconductor layer than the substrate.

4. The field-effect transistor according to claim 1, wherein the high carrier concentration layer has a thickness of not less than 10 nm and not greater than 10 μm.

5. The field-effect transistor according to claim 1, wherein the low carrier concentration layer of the first semiconductor layer comprises:
- a first area that, in the thickness direction, is located on a substrate side of the high carrier concentration layer, and
- a second area that, in the thickness direction, is located on a second semiconductor layer side of the high carrier concentration layer, wherein the carrier concentration in the first area is equal to the carrier concentration in the second area, and wherein the carrier concentration of the first area and the carrier concentration of the second area are lower than the carrier concentration of the high carrier concentration layer.

6. The field-effect transistor according to claim 1, the field-effect transistor having a configuration such that a plurality of cells in an identical shape are regularly arrayed in the plane direction, wherein a distance from the second semiconductor layer to the high carrier concentration layer is not greater than half a cell pitch of the cells.

7. The field-effect transistor according to claim 1, wherein the first semiconductor layer mainly comprises a compound semiconductor.

8. The field-effect transistor according to claim 1, wherein the first semiconductor layer mainly comprises gallium nitride (GaN).

9. The field-effect transistor according to claim 1, further comprising:
- a third area that is located between the second semiconductor layer and the high carrier concentration layer and has the other characteristic, wherein the third area is located away from the trench in the plane direction, and wherein the third area is located away from the high carrier concentration layer in the thickness direction.

10. A power converter, comprising the field-effect transistor according to claim 1.

11. The field-effect transistor according to claim 1, wherein the field-effect transistor has a configuration such that a plurality of cells are arranged in at least one of an x-axis direction and a y-axis direction.

12. The field-effect transistor according to claim 1, further comprising:
- a gate electrode coupled to the insulating film; and
- a source electrode coupled to a top of the semiconductor device, and a drain electrode as a third electrode coupled to the substrate.

13. The field-effect transistor according to claim 1, wherein the high carrier concentration layer having the peak of the carrier concentration in the first semiconductor layer is extended in the plane direction along a full length of the field-effect transistor.

14. A field-effect transistor, comprising:
- a substrate of the field-effect transistor that is extended in a plane direction;
- a first semiconductor layer that is located above the substrate and has one characteristic out of an n-type characteristic and a p-type characteristic;
- a second semiconductor layer that is located above the first semiconductor layer and has an other characteristic out of the n-type characteristic and the p-type characteristic which is different from the one characteristic;
- a third semiconductor layer that is located above the second semiconductor layer and has the one characteristic;
- a trench that is formed from the third semiconductor layer to penetrate through the second semiconductor layer and to be recessed into the first semiconductor layer; and
- an insulating film that is arranged to cover a surface of the trench, wherein the first semiconductor layer has a carrier concentration that provides a peak in a thickness direction perpendicular to the plane direction, wherein the first semiconductor layer includes:
- a high carrier concentration layer having a peak of the carrier concentration and extending in the plane direction at a location away from the trench to be located on a substrate side of the trench, the high carrier concentration layer being separated from the trench and separated from a joint surface between the first semiconductor layer and the second semiconductor layer, and
- a low carrier concentration layer having a carrier concentration lower than the carrier concentration of the high carrier concentration layer, the low carrier concentration layer being disposed in the thickness direction on opposing sides of the high carrier concentration layer, wherein the high carrier concentration has a carrier concentration of $5.0 \times 10^{17}$ cm$^{-3}$ and a thickness of 0.05 μm, wherein the low carrier concentration layer is formed on the high carrier concentration layer by regrowth after ion implantation of the high carrier concentration layer, and wherein, in the thickness direction, a bottom surface of the trench is located above a to surface of the high carrier concentration layer.

15. The field-effect transistor according to claim 14, wherein the carrier concentration represents a donor or acceptor concentration, from a same impurity carrier as that of the first semiconductor layer.

16. The field-effect transistor according to claim 1, wherein, in the thickness direction, the low carrier concentration layer sandwiches the high carrier concentration layer, the carrier concentration of the low carrier concentration layer being the same on the opposing sides of the high carrier concentration layer.

17. The field-effect transistor according to claim 1, wherein, in the thickness direction, the low carrier concentration layer is disposed between the bottom surface of the trench and the high carrier concentration layer.

18. The field-effect transistor according to claim 1, wherein the insulating film abuts the low carrier concentration layer of the first semiconductor layer.

19. The field-effect transistor according to claim 5, wherein the first area and the second area have the one characteristic out of the n-type characteristic and the p-type characteristic.

20. A field-effect transistor, comprising:
- a substrate of the field-effect transistor that is extended in a plane direction;
- a first semiconductor layer that is located above the substrate and has one characteristic out of an n-type characteristic and a p-type characteristic;
- a second semiconductor layer that is located above the first semiconductor layer and has an other characteristic out of the n-type characteristic and the p-type characteristic which is different from the one characteristic;
- a third semiconductor layer that is located above the second semiconductor layer and has the one characteristic;
- a trench that is formed from the third semiconductor layer to penetrate through the second semiconductor layer and to be recessed into the first semiconductor layer, and
- an insulating film that is arranged to cover a surface of the trench, wherein the first semiconductor layer has a carrier concentration that provides a peak in a thickness direction perpendicular to the plane direction, wherein the first semiconductor layer includes:
- a high carrier concentration layer having a peak of the carrier concentration and extending in the plane direction at a location away from the trench to be located on a substrate side of the trench, the high carrier concentration layer being separated from the trench and separated from a joint surface between the first semiconductor layer and the second semiconductor layer, and
- a low carrier concentration layer having a carrier concentration lower than the carrier concentration of the high carrier concentration layer, the low carrier concentration layer being disposed in the thickness direction on opposing sides of the high carrier concentration layer, wherein the carrier concentration represents a concentration of a donor or an acceptor, the donor or acceptor being a same impurity carrier as that of the first semiconductor layer, wherein the low carrier concentration layer is formed on the high carrier concentration layer by regrowth after ion implantation of the high carrier concentration layer, wherein the low carrier concentration layer of the first semiconductor layer comprises:
- a first low carrier concentration layer and a second low carrier concentration layer, wherein, in the thickness direction, the first low carrier concentration layer, the high carrier concentration layer, and the second low carrier concentration layer are arranged in this order, wherein the second low carrier concentration layer is located closer to the second semiconductor layer than the first low carrier concentration layer and has a thickness less than a thickness of the first low carrier concentration layer, and wherein, in the thickness direction, a bottom surface of the trench is located above a top surface of the high carrier concentration layer.

21. The field-effect transistor according to claim 1, wherein the high carrier concentration layer is entirely spaced away from the trench.

* * * * *